US009287143B2

(12) United States Patent
Chen et al.

(10) Patent No.: US 9,287,143 B2
(45) Date of Patent: Mar. 15, 2016

(54) APPARATUS FOR PACKAGE REINFORCEMENT USING MOLDING UNDERFILL

(71) Applicant: Taiwan Semiconductor Manufacturing Company, Ltd., Hsin-Chu (TW)

(72) Inventors: Hsien-Wei Chen, Hsin-Chu (TW); Tsung-Yuan Yu, Taipei (TW); Wen-Hsiung Lu, Jhonghe (TW); Ming-Da Cheng, Jhubei (TW); Hao-Yi Tsai, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/939,966

(22) Filed: Jul. 11, 2013

(65) Prior Publication Data
US 2014/0159223 A1 Jun. 12, 2014

Related U.S. Application Data

(63) Continuation-in-part of application No. 13/349,405, filed on Jan. 12, 2012, and a continuation-in-part of application No. 13/751,289, filed on Jan. 28, 2013, and a continuation-in-part of application No. 13/913,599,
(Continued)

(51) Int. Cl.
*H01L 23/48* (2006.01)
*H01L 21/56* (2006.01)
(Continued)

(52) U.S. Cl.
CPC .......... *H01L 21/563* (2013.01); *H01L 23/3157* (2013.01); *H01L 23/3192* (2013.01);
(Continued)

(58) Field of Classification Search
CPC .............. H01L 23/3185; H01L 21/563; H01L 23/3157; H01L 23/3192; H01L 24/05; H01L 21/56; H01L 21/568; H01L 2224/02331; H01L 2224/03823; H01L 2224/0401; H01L 2224/05008; H01L 2224/05082; H01L 2224/05147; H01L 2224/05166
USPC .................. 257/678, 690, 737–738, 787–794
See application file for complete search history.

(56) References Cited

U.S. PATENT DOCUMENTS 6,369,451 B2   4/2002  Lin
7,187,068 B2   3/2007  Suh et al.
(Continued)

FOREIGN PATENT DOCUMENTS

CN   101002318 A   7/2007
CN   102097397 A   6/2011
(Continued)

*Primary Examiner* — Thanh T Nguyen
(74) *Attorney, Agent, or Firm* — Slater & Matsil, L.L.P.

(57) ABSTRACT

A method and apparatus for a reinforced package are provided. A package component may be electrically coupled to a device through a plurality of electrical connections. A molding underfill may be interposed between the package component and the device and may encapsulate the plurality of electrical connections or a subset of the plurality of electrical connections between the package component and the device. The package component may also include a molding compound. The plurality of the electrical connections may extend through the molding compound with the molding underfill interposed between the molding compound and the device to encapsulate the plurality of electrical connections or a subset of the plurality of electrical connections between the package component and the device. The molding underfill may extend up one or more sides of the package component.

20 Claims, 5 Drawing Sheets

Related U.S. Application Data filed on Jun. 10, 2013, and a continuation-in-part of application No. 13/914,426, filed on Jun. 10, 2013, and a continuation-in-part of application No. 13/838,748, filed on Mar. 15, 2013, and a continuation-in-part of application No. 13/868,554, filed on Apr. 23, 2013, now Pat. No. 8,987,058, and a continuation-in-part of application No. 13/934,562, filed on Jul. 3, 2013.

(60) Provisional application No. 61/776,282, filed on Mar. 11, 2013, provisional application No. 61/746,687, filed on Dec. 28, 2012, provisional application No. 61/765,322, filed on Feb. 15, 2013, provisional application No. 61/776,714, filed on Mar. 11, 2013, provisional application No. 61/776,684, filed on Mar. 11, 2013, provisional application No. 61/778,341, filed on Mar. 12, 2013, provisional application No. 61/777,709, filed on Mar. 12, 2013.

(51) Int. Cl.
    *H01L 23/31*  (2006.01)
    *H01L 23/00*  (2006.01)

(52) U.S. Cl.
    CPC ............... *H01L24/05* (2013.01); *H01L 21/56* (2013.01); *H01L 21/568* (2013.01); *H01L 23/3114* (2013.01); *H01L 24/03* (2013.01); *H01L 24/11* (2013.01); *H01L 24/13* (2013.01); *H01L 2224/02331* (2013.01); *H01L 2224/03823* (2013.01); *H01L 2224/0401* (2013.01); *H01L 2224/05008* (2013.01); *H01L 2224/05082* (2013.01); *H01L 2224/05147* (2013.01); *H01L 2224/05166* (2013.01); *H01L 2224/05181* (2013.01); *H01L 2224/05186* (2013.01); *H01L 2224/05547* (2013.01); *H01L 2224/05548* (2013.01); *H01L 2224/05564* (2013.01); *H01L 2224/05567* (2013.01); *H01L 2224/05611* (2013.01); *H01L 2224/05647* (2013.01); *H01L 2224/05655* (2013.01); *H01L 2224/05664* (2013.01); *H01L 2224/10126* (2013.01); *H01L 2224/1191* (2013.01); *H01L 2224/11464* (2013.01); *H01L 2224/13022* (2013.01); *H01L 2224/13082* (2013.01); *H01L 2224/13111* (2013.01); *H01L 2224/13147* (2013.01); *H01L 2224/16238* (2013.01); *H01L 2224/3205* (2013.01); *H01L 2224/32225* (2013.01); *H01L 2224/33135* (2013.01); *H01L 2224/73104* (2013.01); *H01L 2224/73203* (2013.01); *H01L 2224/73204* (2013.01); *H01L 2224/81191* (2013.01); *H01L 2224/831* (2013.01); *H01L 2224/83191* (2013.01); *H01L 2224/92225* (2013.01); *H01L 2924/00014* (2013.01); *H01L 2924/01322* (2013.01); *H01L 2924/1461* (2013.01); *H01L 2924/181* (2013.01)

(56) References Cited

U.S. PATENT DOCUMENTS

| | | |
|---|---|---|
| 2004/0012930 A1 | 1/2004 | Grigg |
| 2004/0118599 A1 | 6/2004 | Chason et al. |
| 2004/0188131 A1 | 9/2004 | Dunlap |
| 2004/0251561 A1 | 12/2004 | Wilson et al. |
| 2005/0006766 A1* | 1/2005 | Nakayoshi et al. ........... 257/738 |
| 2005/0080956 A1 | 4/2005 | Zaudtke et al. |
| 2005/0287699 A1 | 12/2005 | Brauer |
| 2008/0044951 A1 | 2/2008 | Bang et al. |
| 2009/0045513 A1 | 2/2009 | Kim et al. |
| 2009/0140442 A1 | 6/2009 | Lin |
| 2009/0256268 A1 | 10/2009 | Ayotte et al. |
| 2010/0096754 A1 | 4/2010 | Lee et al. |
| 2010/0140760 A1 | 6/2010 | Tam et al. |
| 2011/0128711 A1 | 6/2011 | Yim et al. |
| 2011/0157853 A1 | 6/2011 | Goh |
| 2013/0009307 A1 | 1/2013 | Lu et al. |
| 2013/0093084 A1 | 4/2013 | Chen et al. |
| 2013/0181338 A1 | 7/2013 | Lu et al. |
| 2014/0054764 A1 | 2/2014 | Lu et al. |
| 2014/0077361 A1 | 3/2014 | Lin et al. |

FOREIGN PATENT DOCUMENTS

| | | |
|---|---|---|
| DE | 102005040213 A1 | 3/2006 |
| DE | 112005001949 T5 | 5/2007 |
| JP | 11255864 | 9/1999 |
| KR | 19990086280 | 12/1999 |
| KR | 20050084487 | 8/2005 |
| KR | 100780956 | 12/2007 |
| KR | 20090018442 A | 2/2009 |
| KR | 20090120215 A | 11/2009 |
| KR | 20100131180 A | 12/2010 |

* cited by examiner

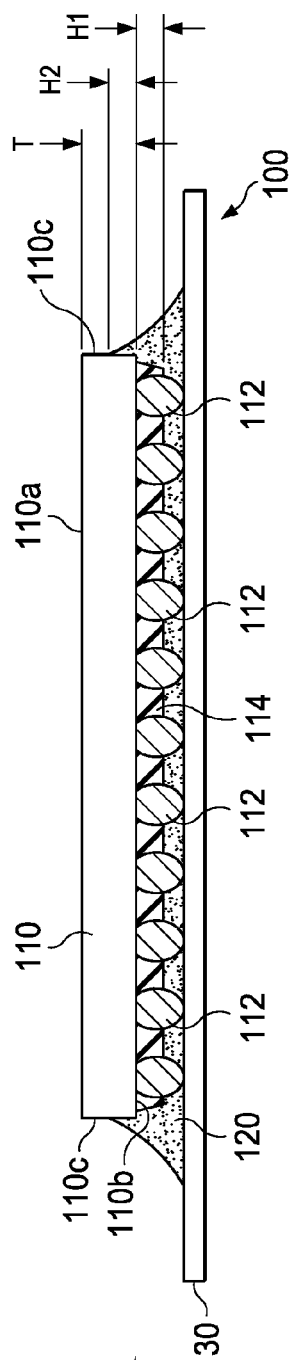
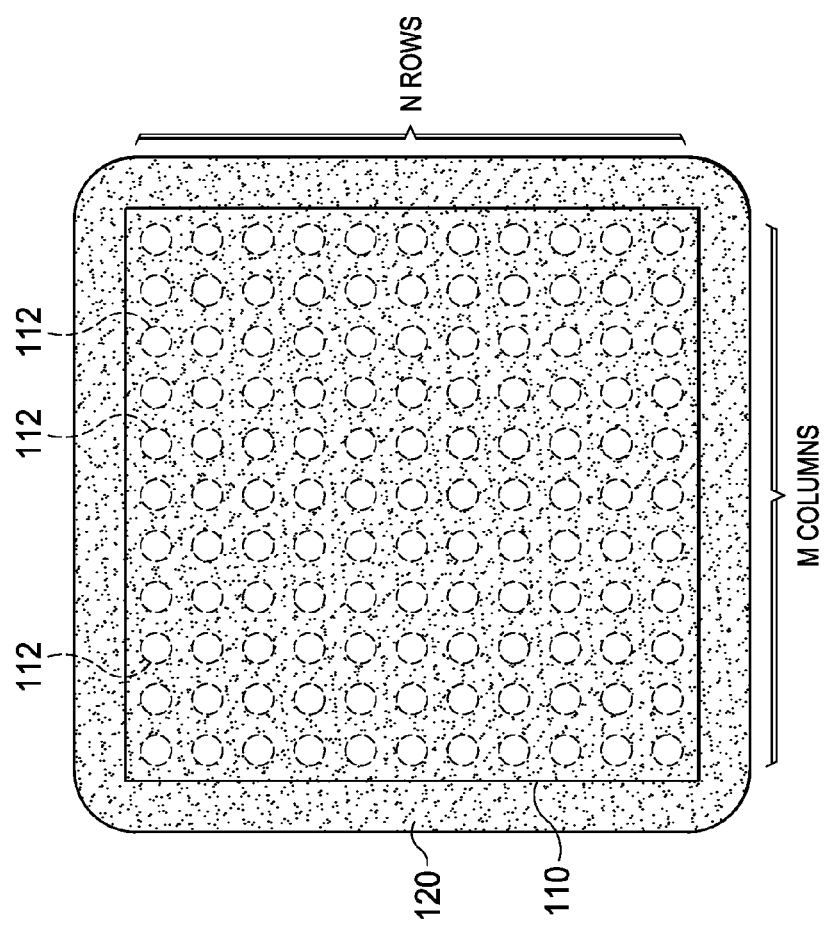
FIG. 1A
FIG. 1B

APPARATUS FOR PACKAGE REINFORCEMENT USING MOLDING UNDERFILL

This application claims priority to U.S. Provisional Application No. 61/776,282, filed on Mar. 11, 2013, and entitled "Apparatus and Method for Package Reinforcement," which application is incorporated herein by reference in its entirety. This application is a continuation-in-part of U.S. patent application Ser. No. 13/349,405, filed on Jan. 12, 2012, and entitled "Package on Package Interconnect Structure," which application is incorporated herein by reference in its entirety. This application is a continuation-in-part of U.S. patent application Ser. No. 13/751,289, filed on Jan. 28, 2013, and entitled "System and Method for an Improved Fine Pitch Joint," which application further claims priority to U.S. Provisional Application No. 61/746,687, filed on Dec. 28, 2012, and entitled "System and Method for an Improved Fine Pitch Joint," which applications are incorporated herein by reference in their entirety. This application is a continuation-in-part of U.S. patent application Ser. No. 13/913,599, filed on Jun. 10, 2013, and entitled "Interconnect Joint Protective Layer Apparatus and Method," which application further claims priority to U.S. Provisional Application No. 61/765,322, filed on Feb. 15, 2013, and entitled "Interconnect Joint Protective Layer Apparatus and Method," which applications are incorporated herein by reference in their entirety. This application is a continuation-in-part of U.S. patent application Ser. No. 13/914,426, filed on Jun. 10, 2013, and entitled "Interconnect Structures and Methods of Forming Same," which application further claims priority to U.S. Provisional Application No. 61/776,714, filed on Mar. 11, 2013, and entitled "Interconnect Structures and Methods of Forming Same," which applications are incorporated herein by reference in their entirety. This application is a continuation-in-part of U.S. patent application Ser. No. 13/838,748, filed on Mar. 15, 2013, and entitled "Interconnect Structures and Methods of Forming Same," which application further claims priority to U.S. Provisional Application No. 61/776,684, filed on Mar. 11, 2013, and entitled "Interconnect Structures and Methods of Forming Same," which applications are incorporated herein by reference in their entirety. This application is a continuation-in-part of U.S. patent application Ser. No. 13/868,554, filed on Apr. 23, 2013, and entitled "Apparatus and Method for Wafer Separation," which application further claims priority to U.S. Provisional Application No. 61/778,341, filed on Mar. 12, 2013, and entitled "Apparatus and Method for Wafer Separation," which applications are incorporated herein by reference in their entirety. This application is a continuation-in-part of U.S. patent application Ser. No. 13/934,562, filed on Jul. 3, 2013, and entitled "Packaging Devices, Methods of Manufacture Thereof, and Packaging Methods," which application further claims priority to U.S. Provisional Application No. 61/777,709, filed on Mar. 12, 2013, and entitled "Packaging Devices, Methods of Manufacture Thereof, and Packaging Device Design Methods," which applications are incorporated herein by reference in their entirety.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has resulted from repeated reductions in minimum feature size, which allows more components to be integrated into a given area. These smaller electronic components have led to smaller packages, which utilize less area than previous package types. Some smaller types of packages for semiconductor devices include quad flat pack (QFP), pin grid array (PGA), ball grid array (BGA), flip chips (FC), three dimensional integrated circuits (3D ICs), wafer level packages (WLPs), and package on package (PoP) devices. These package types are vulnerable to stresses or strains, which can degrade electrical connections between a package and a device to which the package is electrically coupled.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1A illustrates a cross-sectional view of a reinforced package according to an embodiment;

FIG. 1B illustrates a simplified top-down view of FIG. 1A;

DETAILED DESCRIPTION

Figure 1C:
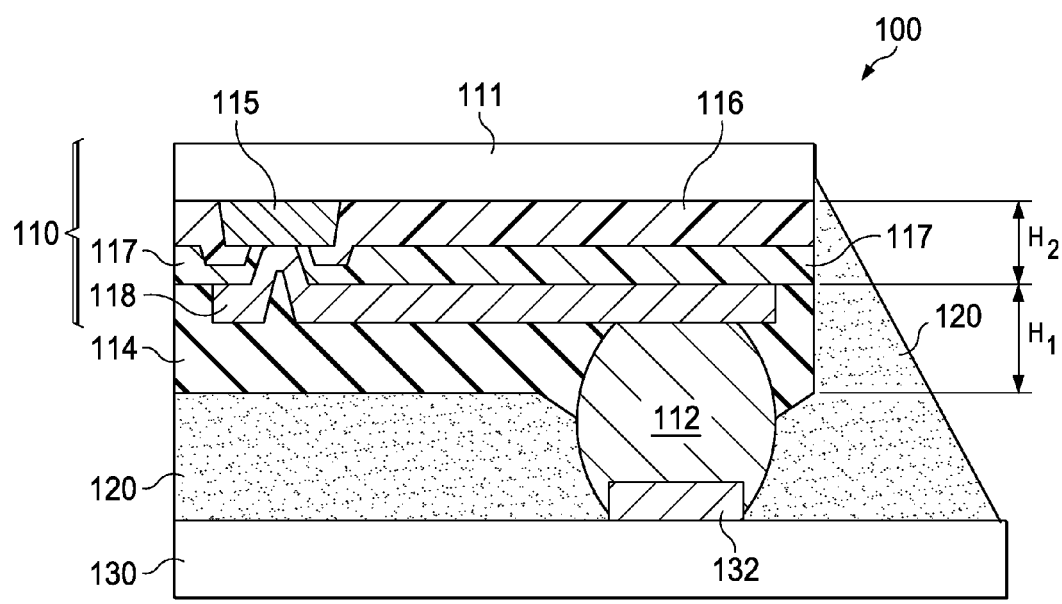
FIG. 1C illustrates a partial cross-sectional view of the reinforced package of FIG. 1A.

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

FIG. 1A illustrates a reinforced package 100 according to an embodiment. As illustrated in FIG. 1A, the reinforced package 100 may include a package component 110, a plurality of electrical connections 112, and a molding underfill ("MUF") 120. The package component 110 may have a first horizontal side 110a and a second horizontal side 110b. The package component 110 may have a thickness T. The plurality of electrical connections 112 may be formed on the second horizontal side 110b of the package component 110 and, in an embodiment, a molding compound 114 may be formed over the second horizontal side 110b and may surround each of the plurality of electrical connections 112. The molding compound 114 may be formed to a first height H1 on the second horizontal side 110b of the package component. In various embodiments, the first height H1 may range from approximately 50 μm to approximately 250 μm. The molding compound 114 may encapsulate and/or seal the second horizontal side 110b of the package component 110. Through the plurality of electrical connections 112, the package component 110 may be electrically coupled to a device 130. Various processes for forming a package component and corresponding molding compound are described in commonly assigned, co-pending U.S. patent application Ser. No. 13/838,748, entitled "Interconnect Structures and Methods of Forming Same," filed on Mar. 15, 2013, which application is hereby incorporated by reference in its entirety.

The MUF 120 may be formed to encapsulate all or a selected number and/or group of the plurality of electrical connections 112 between the package component 110 and the device 130. In an embodiment, as shown in FIG. 1A, the MUF 120 may be interposed between the molding compound 114 and the device 130 and encapsulate all of the plurality of electrical connections 112 between the package component 110 and the device 130.

FIG. 1B provides a simplified top-down of FIG. 1A. As shown in FIG. 1B, the plurality of electrical connections 112 may be formed along N rows and M columns on the second horizontal side 110b of the package component 110. The MUF 120, as shown in the embodiment of FIG. 1B, may encapsulate all of the plurality of electrical connections 112. Although the electrical connections 112 are shown as being uniformly distributed across the package component 110, the electrical connections 112 may be distributed in a non-uniform pattern or a non-uniform spacing, etc. The distribution of the electrical connections 112, as shown in FIGS. 1A-1B is provided for illustrative purposes only and is not meant to limit the scope of the embodiments discussed herein. As discussed in further detail below, the number of the plurality of electrical connections 112 that may be encapsulated by the MUF 120 may be fewer than the number that are illustrated in FIGS. 1A-1B.

The MUF 120 may provide reinforcement support against breaking, cracking, shearing, or other possible damage to the electrical connections 112, which could degrade electrical connectivity between the package component 110 and the device 130. The MUF 120, may, in effect, aid in minimizing lateral, horizontal, and/or torsional stresses or strains between the package component 110, the electrical connections 112, and/or the device 130 that may occur during or following manufacture through thermal fluctuations, physical manipulation, atmospheric pressure changes, etc. In the embodiment, as shown in FIG. 1A, the MUF 120 may extend along one or more vertical sides 110c of the package component 110 to a second height H2. The second height H2 may be varied to effect varying levels of reinforcement for the package component 110. In various embodiments, the second height H2 may range from approximately 50 µm to approximately 250 µm. There may be a relationship between the thickness T of the package component 110, the first height H1 and the second height H2 as follows: $\frac{1}{3}(H1+T) \leq (H1+H2) < (H1+T)$.

In various embodiments, the MUF 120 may be formed of reworkable or non-reworkable materials such as, for example, epoxy, deformable gel, silicon rubber, thermal plastic polymer, thermal set polymer, a combination thereof or the like. In various embodiments, the MUF 120 may include a filler material ranging in size from 10 µm to 50 µm. The MUF 120 may have a glass transition temperature, Tg, ranging from approximately 100° C. to approximately 150° C. In various embodiments, the MUF 120 may be formed using dispensing, injecting, and/or spraying techniques.

FIG. 1C illustrates a detailed view of the package component 110 according to an embodiment. As shown in FIG. 1C, the package component includes a substrate 111, one or more interconnect pad(s) 115 formed on the substrate 111, a pair of passivation layers—first and second passivation layers 116, 117—overlying the substrate 111 and the interconnect pad(s) 115, and one or more post passivation interconnect(s) ("PPI") 118 overlying the pair of passivation layers 116, 117. The PPI 118 is electrically coupled to interconnect pad 115 through the first and second passivation layers 116, 117. Electrical connection 112 is coupled to a connection pad 132 on the device 130. Further description regarding the possible material compositions of the interconnect pad 115, the passivation layers 116, 117 and the PPI 118 are discussed herein with regard to FIG. 4.

As shown in FIG. 1C, the MUF 120 may extend up the sides of the package component 110 to encapsulate the molding compound 114 and the pair of passivation layers 116, 117 and the substrate 111. The height H2 that the MUF 120 extends up the sides of the package component 110 may be varied by adjusting the volume of MUF 120 injected between the package component 110 and the device 130. As noted previously, the first height may range from approximately 50 µm to approximately 250 µm and the second height H2 may range from approximately 50 µm to approximately 250 µm.

In various embodiments, as discussed in further detail below, the package 100 may be formed without a molding compound applied to the second horizontal side 110b of the package component 110. In such embodiments (not shown in FIGS. 1A-1C), the MUF 120 may be formed between the device 130 and the package component 110 in a manner such that the MUF 120 may be interposed between the second horizontal side 110b of package component 110 and the device 130 and may encapsulate the plurality of electrical connections 112. In such embodiments, the MUF 120 may protect interconnects and/or components formed on the second side 110b of the package component 110.

In various embodiments, the package component 110 may be a wafer, a die, a substrate, an interposer or combinations thereof, such as may be used, for example, in stacked or 3D IC type devices (not shown) or in mico-electrical-mechanical system ("MEMS") type devices (not shown). In various embodiments, the package component 110 may include one or more layers of dielectric materials, metal materials, and/or insulating materials which may be used to form interlayer dielectrics ("ILDs"), intermetal dielectrics ("IMDs"). In various embodiments, the package component 110 may include active devices such as, for example, transistors and/or sensors (not shown). In various embodiments, the package component 110 may include passive devices such resistors, capacitors, inductors or other like devices (none shown). In various embodiments, the package component 110 may be free from active and/or passive devices.

In various embodiments, the molding compound 114 may be formed of polymer, liquid epoxy, combinations thereof or the like. The molding compound 114 may include a filler material having a size of less than 10 µm. The molding compound 114 may have a glass transition temperature, Tg, ranging from approximately 130° C. to approximately 200° C. In various embodiments, the electrical connections 112 may be formed of solder, non-eutectic lead, tin, copper, gold, nickel, aluminum alloys, combinations thereof or the like. Although the electrical connections 112, as illustrated in FIG. 1A, are shown as having spherical-like shapes, the electrical connections 112 may also be formed having pillar-like or columnar-like shapes.

In various embodiments, the device 130 may be a printed circuit board ("PCB"), a wafer, a die, a substrate, an interposer, or combinations thereof, such as may be used, for example, 3D IC type devices (not shown) or MEMS type devices (not shown). In various embodiments, the device 130 may include conductive pads (not shown), which may provide for coupling the one or more electrical connections 112 thereto.

The size, shape, type, composition, and/or location of the package component 110, the one or more electrical connections 112, the molding compound 114, and or the device 130 are provided for illustrative purposes only and are not meant to limit the scope of the embodiments discussed herein.

Figures 2A, 2B:
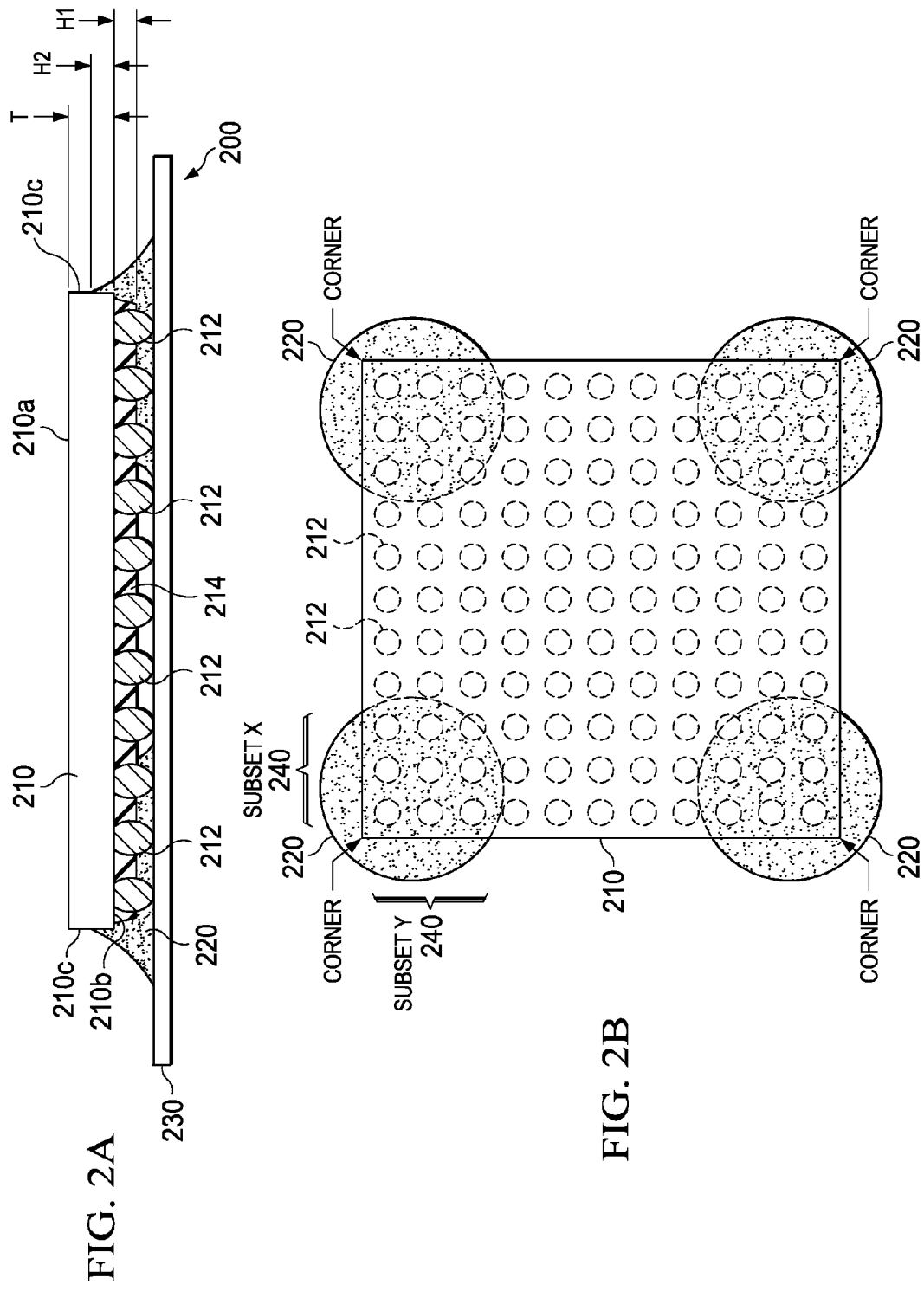
FIG. 2A illustrates a cross-sectional view of another reinforced package according to another embodiment.
FIG. 2B illustrates a simplified top-down view of FIG. 2A.

FIG. 2A illustrates another reinforced package 200 according to another embodiment. As illustrated in FIG. 2A, the reinforced package 200 may include a package component 210, a plurality of electrical connections 212 and a MUF 220. The package component 210 may have a first horizontal side 210a and a second horizontal side 210b and a thickness T. The plurality of electrical connections 212 may be formed on the second horizontal side 210b of the package component 210 and, in an embodiment, a molding compound 214 may be formed over the second horizontal side 210b and may surround each of the plurality of electrical connections 212. The molding compound 214 may be formed to a first height H1 on the second horizontal side 210b of the package component 210 and may provide encapsulation for the second horizontal side 210b of the package component 210. In various embodiments, the first height H1 may range from approximately 50 µm to approximately 250 µm. Through the plurality of electrical connections 212, the package component 210 may be electrically coupled to a device 230.

In an embodiment, as shown in FIG. 2A, the MUF 220 may be interposed between the molding compound 214 and the device 230. In the embodiment, the MUF 220 may extend along one or more vertical sides 210c of the package component 210 to a second height H2. In various embodiments, the second height may range from approximately 50 µm to approximately 250 µm. There may be a relationship between the thickness T of the package component 210, the first height H1 and the second height H2 as follows: $\frac{1}{3}(H1+T) \leq (H1+H2) < (H1+T)$.

In various embodiments, the MUF 220 may be formed of reworkable or non-reworkable materials such as, for example, epoxy, deformable gel, silicon rubber, thermal plastic polymer, thermal set polymer, a combination thereof or the like. In various embodiments, the MUF 220 may include a filler material ranging in size from 10 µm to 50 µm. The MUF 220 may have a glass transition temperature, Tg, ranging from approximately 100° C. to approximately 150° C. The package component 210, electrical connections 212, molding compound 214 and device 230 may have characteristics and/or compositions similar as those described for the various embodiments discussed above with regard to FIG. 1A.

FIG. 2B illustrates a simplified top-down view of FIG. 2A. As shown in FIG. 2B, the plurality of electrical connections 212 may be formed along N rows and M columns on the second horizontal side 210b of the package component 210. In comparison to FIG. 1B, which illustrated the MUF 120 encapsulating all of the plurality of electrical connections 112, FIG. 2B illustrates that the MUF 220 may encapsulate a plurality of subsets 240 of the plurality of electrical connections 212 at one or more of corners of the package component 210. Each of the subsets 240 may include an X-rows by Y-columns group of the plurality of electrical connections 212. For example, the number of X-rows may range from 2 to (N/2)−1 of the total number of N rows and the number of Y-columns may range from 2 to (M/2)−1 of the total number of M columns.

The configuration of the MUF 220 of FIGS. 2A-2B at the one or corners of the package component 210 may provide reinforcement support for the electrical connections 212 between the package component 210 and the device 230. In comparison to the configuration of the MUF 120 of FIGS. 1A-1B, which may cover all the electrical connections 112, the MUF 220 of FIGS. 2A-2B may provide reinforcement support at a reduced cost over the configuration of FIGS. 1A-1B. For example, less MUF 220 may be used in the configuration as shown in FIGS. 2A-2B, thus the overall costs of manufacturing the reinforced package 200 may be reduced. Compared to the reinforcement support of the MUF 120 of FIGS. 1A-1B, the reinforcement support of the MUF 220 may be reduced for the electrical connections 212 of FIGS. 2A-2B but may still be sufficient for the reinforced package 200 for particular applications.

Each of the subsets 240 shown in FIG. 2B may include a 3-by-3 group of the plurality of the electrical connections 212 at the corresponding corners of the package component 210 that may be encapsulated by the MUF 220. The number of electrical connections 212 in the subsets 240 may be more or fewer than the number as illustrated in FIG. 2B. The number of electrical connections 212 in each of the subsets 240, as shown in FIG. 2B, is provided for illustrative purposes only and is not meant to limit the scope of the embodiments discussed herein. Moreover, the number of corners of the package component 210 wherein the subsets 240 of electrical connections 212 may be encapsulated by the MUF 220 may be fewer than the number of corners as illustrated in FIG. 2B. In an embodiment, the MUF 220 covers a pair of adjacent rows and columns of electrical connections 212 for each side of a corner at the corresponding corner of the package component 210. Further, as shown in FIG. 2B, the MUF 220 may contact but may not fully encapsulate some of the interior electrical connections 212 for the package component 210. The volume of the MUF 220 applied between the package component 210 and the device 230 may be varied to affect the number of electrical connections 212 that are fully encapsulated by the MUF 220.

Figure 3A:
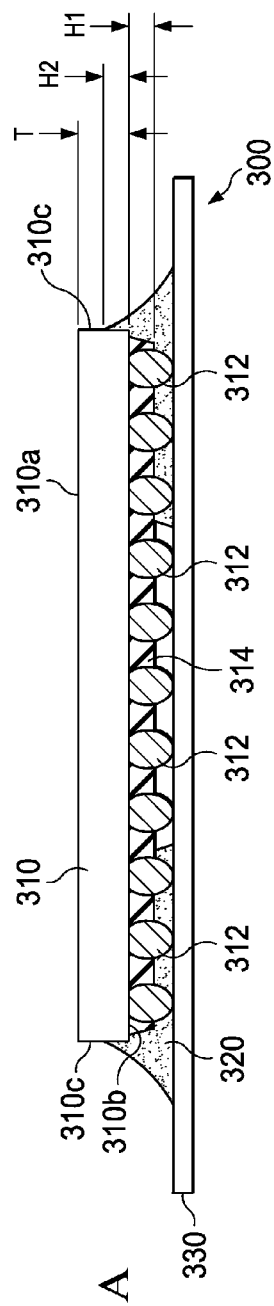
FIG. 3A illustrates a cross-sectional view of another reinforced package according to another embodiment.

FIG. 3A illustrates another reinforced package 300 according to another embodiment. As illustrated in FIG. 3A, the reinforced package 300 may include a package component 310 and a MUF 320. The package component 310 may have a first horizontal side 310a and a second horizontal side 310b and a thickness T. A plurality of electrical connections 312 may be formed on the second horizontal side 310b of the package component 310 and, in an embodiment, a molding compound 314 may be formed over the second horizontal side 310b and may surround each of the plurality of electrical connections 312. The molding compound 314 may be formed to a first height H1 on the second horizontal side 310b of the package component 310 and may encapsulate the second horizontal side 310b of the package component 310. In various embodiments, the first height H1 may range from approximately 50 µm to approximately 250 µm. Through the plurality of electrical connections 312, the package component 310 may be electrically coupled to a device 330.

In an embodiment, as shown in FIG. 3A, the MUF 320 may be interposed between the molding compound 314 and the device 330. In the embodiment, the MUF 320 may extend along one or more vertical sides 310c of the package component 310 to a second height H2. In various embodiments, the second height H2 may range from approximately 50 µm to approximately 250 µm. There may be a relationship between the thickness T of the package component 310, the first height H1 and the second height H2 as follows: $\frac{1}{3}(H1+T) \leq (H1+H2) < (H1+T)$.

In various embodiments, the MUF 320 may be formed of reworkable or non-reworkable materials such as, for example, epoxy, deformable gel, silicon rubber, a combination thereof or the like. In various embodiments, the MUF 320 may include a filler material ranging in size from 10 µm to 50 µm. The MUF 320 may have a glass transition temperature, Tg, ranging from approximately 100° C. to approximately 150° C. The package component 310, electrical connections 312, molding compound 314 and device 330 may have similar characteristics and/or compositions as those described for the various embodiments discussed above with regard to FIG. 1A.

Figure 3B:
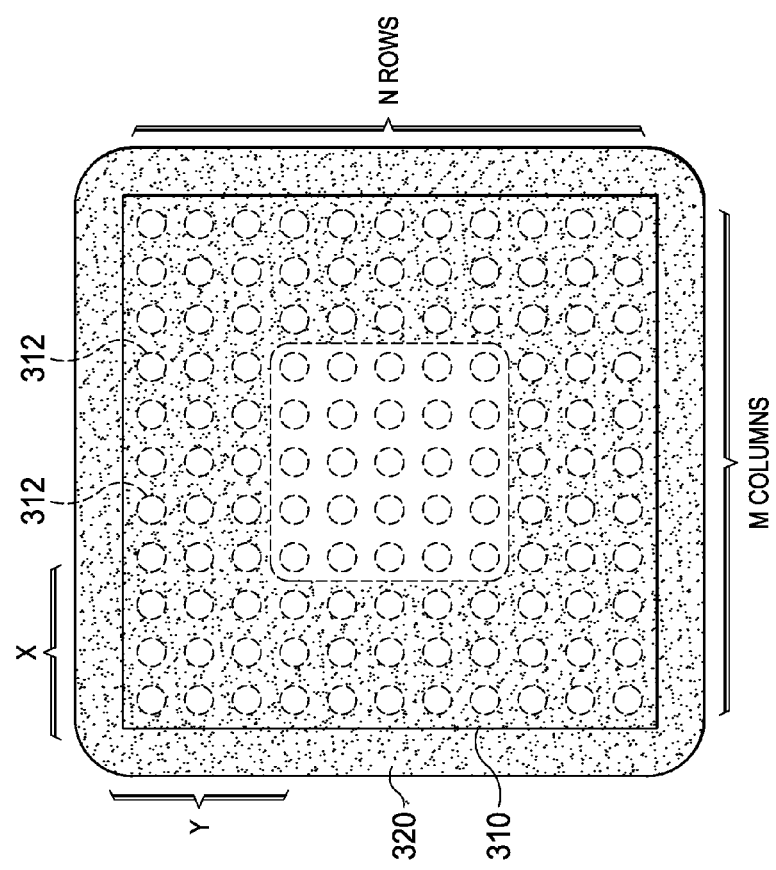
FIG. 3B illustrates a simplified top-down view of FIG. 3A.

FIG. 3B illustrates a simplified top-down view of FIG. 3A. As shown in FIG. 3B, the plurality of electrical connections 312 may be formed along N rows and M columns on the second horizontal side 310b of the package component 310. In comparison to the MUF 120 of FIGS. 1A-1B and the MUF 220 of FIGS. 2A-2B, the MUF 320, as shown in FIG. 3B, may be formed along a perimeter of the package component 310 and may encapsulate the electrical connections 312 at the perimeter thereof between the package component 310 and the device 330. The electrical connections 312 that may be encapsulated by the MUF 320 may include a number of rows X, which may represent a subset of the number of N rows and a number of columns, Y, which may represent a subset of the number of M columns along the perimeter of the package component 310. In various embodiments, the number of rows X may range from 2 to (N/2)−1 of the total number of N rows and the number of columns Y may range from 2 to (M/2)−1 of the total number of M columns.

The configuration of the MUF 320 of FIG. 3B along the perimeter of the package component 310 may provide reinforcement support for the electrical connections 312 between the package component 310 and the device 330. The MUF 320 of FIGS. 3A-3B may provide a balanced reinforcement support and manufacturing cost tradeoff between the entire coverage of all the electrical connections 112, as shown in FIGS. 1A-1B and the corner electrical connections 212, as shown in FIGS. 2A-2B.

As illustrated in FIG. 3B, the perimeter of the electrical connections 312 that may be encapsulated by the MUF 320 may include 3-rows and 3-columns along the perimeter of the package component 310. The number of electrical connections 312 that may be encapsulated by the MUF 320 along the perimeter of the package component 310 may be more or fewer than the number as illustrated in FIG. 3B. The number of electrical connections 312 encapsulated by the MUF 320, as shown in FIG. 3B, is provided for illustrative purposes only and is not meant to limit the scope of the embodiments discussed herein. The MUF 320 need not be formed along the entire perimeter of the package component 310, but rather may be formed along a partial perimeter of the package component 310, for example along one or more perimeter lengths of the package component 310. In an embodiment, the MUF 320 encapsulates a pair of adjacent rows and columns of electrical connections 312 for each side of a corner at the corresponding corner of the package component 310. In an embodiment, the MUF 320 may contact but may not fully encapsulate some of the interior electrical connections 312 for the package component 310. The volume of the MUF 320 applied between the package component 310 and the device 330 may be varied to affect the number of electrical connections 312 that are fully encapsulated by the MUF 320.

Figure 4:
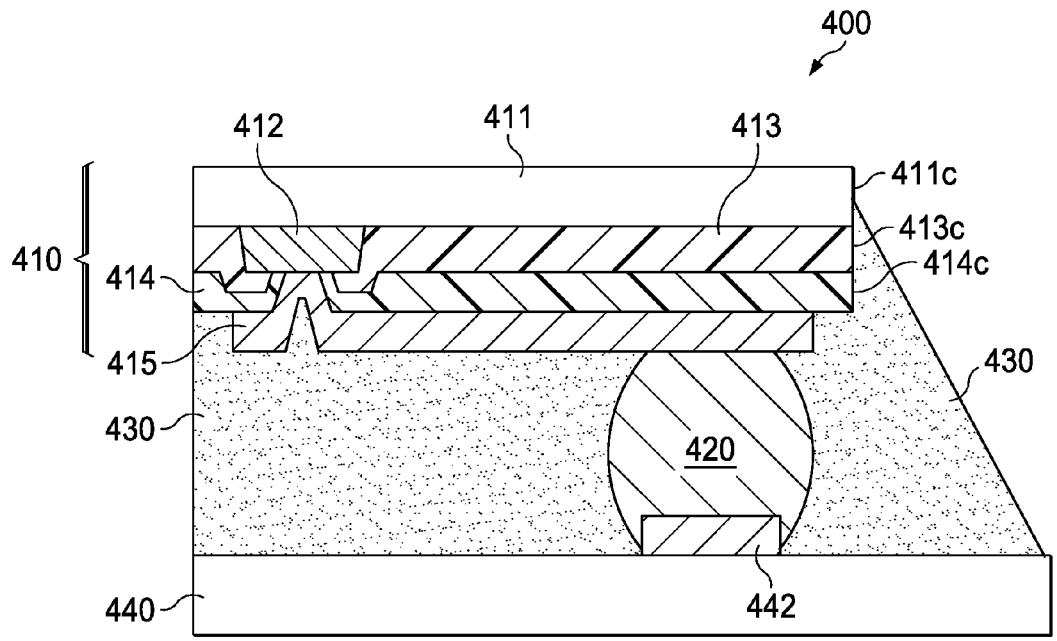
FIG. 4 illustrates a partial cross-sectional view of yet another reinforced package according to an embodiment.

FIG. 4 illustrates a partial cross-sectional view of another reinforced package 400 according to another embodiment. The reinforced package 400 may include a package component 410, a plurality of electrical connections 420, and a MUF 430. The package component 410 may include a substrate 411, one or more interconnect pad(s) 412 formed on the substrate 411, a pair of passivation layers—first and second passivation layers 413, 414—overlying the substrate 411 and the interconnect pad(s) 412, and one or more post passivation interconnect(s) ("PPI") 415 overlying the pair of passivation layers 413, 414. Each PPI 415 may be electrically coupled to one of the corresponding interconnect pads 412.

Through the plurality of electrical connections 420, the package component 410 may be electrically coupled to a device 440. The device 440 may include one or more conductive pad(s) 442, each of which may provide a location for coupling one of the corresponding electrical connections 420 of the package 400. A single electrical connection 420, interconnect pad 412, PPI 415, and conductive pad 442 are shown in FIG. 4 for illustrative purposes only and are not meant to limit the scope of the embodiments discussed herein.

As illustrated in FIG. 4, the MUF 430 may be formed between the package component 410 and the device 440. The MUF 430 may encapsulate the plurality of electrical connections 420 and may also encapsulate the PPI(s) 415, the second passivation layer 414, the first passivation layer 413 and/or the substrate 411 of the package component 410. In comparison to the package component 110 FIG. 1A, a molding compound may not be formed over the package component 410 of FIG. 4; rather the MUF 430 provides encapsulation for the package component 410 as well as provides reinforcement support for the electrical connections 420 between the package component 410 and the device 440. The MUF 430 encapsulated the PPI 415 to protect it from oxidation. In an embodiment, the MUF 430 may extend along sides of the package component 410. For example, the MUF 430 may extend along sides 414c of the second passivation layer 414, along sides 413c of the first passivation layer 413, and/or along sides 411c of the substrate 411 to protect these components.

In various embodiments, the MUF 430 may be formed of reworkable or non-reworkable materials such as, for example, epoxy, deformable gel, silicon rubber, thermal plastic polymer, thermal set polymer, combinations thereof or the like. The MUF 430 may include a filler material ranging in size from approximately 10 μm to approximately 50 μm and may have a glass transition temperature, Tg, ranging from approximately 100° C. to approximately 150° C. In various embodiments, the MUF 430 may be formed using dispensing, injecting, and/or spraying techniques.

In various embodiments, the substrate 411 may be a wafer, a die, an interposer or combinations thereof, such as may be used, for example, in stacked or 3D IC type devices (not shown) or in MEMS type devices (not shown). In various embodiments, one or more layers of dielectric materials, metal materials, and/or insulating materials which may be used to form interlayer dielectrics ("ILDs"), intermetal dielectrics ("IMDs"), and/or passivation layers (none shown) within the substrate. In various embodiments, the substrate 411 may include active devices such as, for example, transistors and/or sensors (both not shown). In various embodiments, the substrate 411 may include passive devices such resistors, capacitors, inductors or other like devices (none shown). In various embodiments, the substrate 411 may be free from active and/or passive devices.

In various embodiments, the interconnect pad(s) 412 may be formed of copper, zinc, nickel, gold, silver, platinum, palladium, aluminum, alloys thereof or the like. In various embodiments, interconnect pad(s) may be formed by thermal chemical vapor deposition ("CVD"), physical vapor deposition ("PVD") such as sputtering or evaporation, electron gun, ion beam, energy beam, plating, one or more subtractive etch processes, single Damascene techniques, and/or dual-Damascene techniques, the like or other acceptable methods.

In various embodiments, the first and/or second passivation layers 413, 414 may be formed of, for example, a polyimide, polybenzoxazole ("PBO"), benzocyclobutene ("BCB"), a non-photosensitive polymer, and in alternative embodiments, may be formed of nitride, carbide, silicon oxide, silicon nitride, low-k dielectrics such as carbon doped oxides, extremely low-k dielectrics such as porous carbon doped silicon dioxide combinations thereof, and/or other like material.

In various embodiments, the plurality of electrical connections 420 may be formed of solder, non-eutectic lead, tin, copper, gold, nickel, aluminum alloys, combinations thereof or the like. Although the electrical connection 420, as illustrated in FIG. 4, is shown as having a spherical-like shape, the electrical connection(s) 420 may also be formed having a pillar-like or a columnar-like shape. In various embodiments, the device 440 may be a printed circuit board ("PCB"), a wafer, a die, a substrate, an interposer, or combinations thereof, such as may be used, for example, 3D IC type devices (not shown) or MEMS type devices (not shown). In various embodiments, the conductive pads 442 may be formed of copper, zinc, nickel, gold, silver, platinum, palladium, aluminum, alloys thereof or the like.

In various embodiments, the PPI(s) 415 copper, zinc, nickel, gold, silver, platinum, palladium, aluminum, alloys thereof or the like. In various embodiments, interconnect pad(s) may be formed by thermal chemical vapor deposition ("CVD"), physical vapor deposition ("PVD") such as sputtering or evaporation, electron gun, ion beam, energy beam, plating, one or more subtractive etch processes, single Damascene techniques, and/or dual-Damascene techniques, the like or other acceptable methods.

Figure 5:
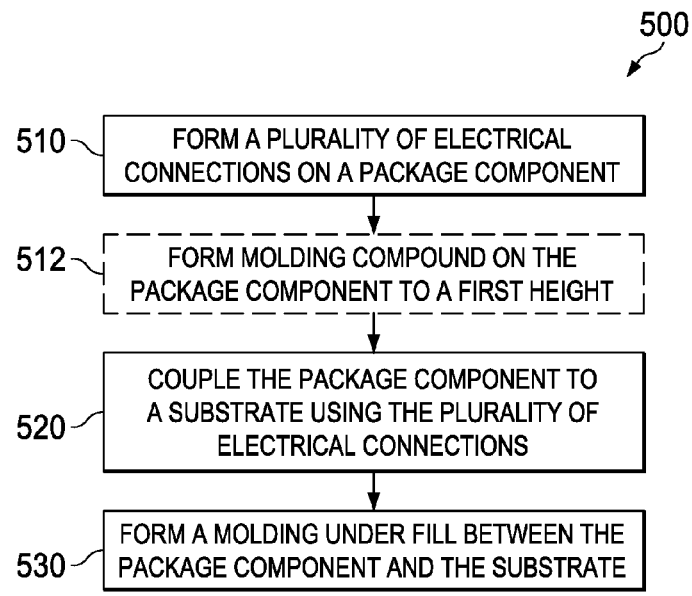
FIG. 5 illustrates a method according to an embodiment.

FIG. 5 illustrates a method 500 according to an embodiment. The method 500 forms a plurality of electrical connections on a first horizontal side of a package component (block 510). The method 500 forms the electrical connections along N rows and M columns on the first horizontal side of the package component. Optionally, the method 500 forms a molding compound on the first horizontal side of the package component to a first height (block 512). The molding compound is formed around the plurality of electrical connections to the first height.

The method 500 couples the package component to a substrate using the plurality of electrical connections (block 520). The method 500 forms a molding underfill between the package component and the substrate (block 530). The molding underfill encapsulates one or more of the plurality of electrical connections between the package component and the substrate. In an embodiment, the molding underfill may be formed to a second height along vertical sides of the package component. If a molding compound is used on the first horizontal side of the package component, the method 500 forms the molding underfill between the molding compound of the package component and the substrate.

The molding underfill may be formed to encapsulate a subset of the electrical connections. For example, the molding underfill may encapsulate a subset of X-rows and Y-columns of the plurality of electrical connections along a perimeter of the package component. The number of X rows may less than (N/2)−1 of the total number of N rows and the number of Y columns may be less than (M/2)−1 of the M columns of the electrical connections.

The volume of the molding underfill injected between the package component and the substrate along the perimeter may be varied to adjust the number of X rows and Y columns of electrical connections that are fully encapsulated by the molding underfill. For example, the volume of the molding underfill injected may be increased to fully encapsulate more of the X rows and Y columns of electrical connections along the perimeter and may be decreased to encapsulate less of the X rows and Y columns of electrical connections along the perimeter of the package component. Further, some of the electrical connections at the interior of the package component may be contacted by the molding underfill but may not be fully encapsulated by the molding underfill. Again, the volume of the molding underfill applied between the package component and the substrate will determine the number of electrical connections that are fully encapsulated by the molding underfill or are contacted but not fully encapsulated.

In another example, the molding underfill may encapsulate a plurality of subsets of the plurality of electrical connections at a plurality of corners of the package component. In such an embodiment, each of the plurality of sets may comprise an X-rows by Y-columns set of the plurality of electrical connections at a corner of the package component, wherein X may range from 2 to (N/2)−1 of the total number N rows and Y may range from 2 to (M/2)−1 of the total number of M columns of the electrical connections. Again, the volume of the molding underfill injected between the package component and the substrate at a particular corner may be varied to adjust the number of X rows and Y columns of electrical connections that are fully encapsulated by the molding underfill.

In an embodiment, an apparatus is provided. The apparatus includes a package component, the package component having a first side and a second side; a plurality of electrical connections on the second side of the package component; a device electrically coupled to the plurality of electrical connections; a molding compound formed on the second side of the package component to a first height, wherein the plurality of electrical connections extend through the molding compound; and a molding underfill between the molding compound and the device, wherein the molding underfill encapsulates a subset of the plurality of electrical connections.

In another embodiment, another apparatus is provided. The apparatus a first substrate having a first side and a second side; a plurality of electrical connections formed on the second side of the first substrate; a second substrate electrically coupled to the one or more electrical connections; and a molding underfill interposed directly between the first substrate and the second substrate, wherein the molding underfill encapsulates at least one interconnect formed over the second side of the first substrate.

In another embodiment, a method is provided. The method includes providing a package component, the package component having a plurality of electrical connections and a molding compound on a first side, the molding compound extending to a first height; coupling the package component to a substrate using the plurality of electrical connections; and forming a molding underfill to encapsulate a subset of the plurality of electrical connections between the package component and the substrate.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a package component, the package component having a first side and a second side;
a plurality of electrical connections on the second side of the package component;
a device electrically coupled to the plurality of electrical connections;
a molding compound on the second side of the package component, the molding compound having a first height, wherein the plurality of electrical connections extend through the molding compound; and
a molding underfill between the molding compound and the device, wherein the molding underfill encapsulates a subset of the plurality of electrical connections without encapsulating all of the plurality of the electrical connections.

2. The apparatus of claim 1, wherein the molding underfill is disposed along vertical sides of the package component to a second height.

3. The apparatus of claim 1, wherein the plurality of electrical connections are formed along N rows and M columns on the second side of the package component.

4. The apparatus of claim 3, wherein the subset comprises one or more groups of electrical connections at one or more corners of the package component.

5. The apparatus of claim 4, wherein each of the one or more groups comprises X-rows by Y-columns of the plurality of electrical connections at each of the one or more corners of the package component, and wherein X ranges from 2 to (N/2)−1 and Y ranges from 2 to (M/2)−1.

6. The apparatus of claim 5, wherein X and Y are equal.

7. The apparatus of claim 4, wherein the subset comprises X-rows and Y-columns of the plurality of electrical connections along a side perimeter of the package component and wherein X is less than (N/2)−1 and Y is less than (M/2)−1.

8. The apparatus of claim 7, wherein the subset comprises all side perimeters of the package component.

9. The apparatus of claim 7, wherein X and Y are equal.

10. The apparatus of claim 1, wherein the device is a printed circuit board (PCB), a substrate, a die or an interposer.

11. An apparatus comprising:
a first substrate having a first side and a second side;
a plurality of electrical connections formed on the second side of the first substrate;
a second substrate electrically coupled to the plurality of electrical connections;
a molding compound on the second side of the first substrate, wherein the plurality of electrical connections extend through the molding compound; and
a molding underfill interposed directly between the molding compound and the second substrate, wherein the molding underfill encapsulates less than all of the plurality of electrical connections.

12. The apparatus of claim 11, wherein the molding underfill directly adjoins sidewalls of a pair of passivation layers disposed on the second side of the first substrate.

13. The apparatus of claim 11, wherein the molding underfill is made of epoxy, deformable gel, silicon rubber or combinations thereof.

14. The apparatus of claim 11, wherein the second substrate is a printed circuit board (PCB), a die or an interposer.

15. A device comprising:
a first substrate having a first side and a second side, the second side being opposite the first side;
a plurality of electrical connections formed on the second side of the first substrate;
a second substrate electrically coupled to the plurality of electrical connections;
a molding compound on the second side of the first substrate, the plurality of electrical connections extending through the molding compound; and
a molding underfill between the molding compound and the second substrate in a first region of the device, wherein there is substantially no molding underfill between the molding compound and the second substrate in a second region of the device.

16. The device of claim 15, wherein the molding underfill is disposed along a third side of the first substrate, the third side being substantially perpendicular to the first and second sides.

17. The device of claim 15, wherein the first region of the device comprises a group of electrical connections at each corner of the first substrate.

18. The device of claim 17, wherein each of the groups comprises X-rows by Y-columns of the plurality of electrical connections at each of the corners of the first substrate, and wherein X ranges from 2 to (N/2)−1 and Y ranges from 2 to (M/2)−1.

19. The device of claim 15, wherein the first region of the device comprises X-rows and Y-columns of the plurality of electrical connections along a side perimeter of the first substrate and wherein X is less than (N/2)−1 and Y is less than (M/2)−1.

20. The device of claim 19, wherein the first region of the device comprises all side perimeters of the first substrate.

* * * * *